United States Patent [19]
Hamlin

[11] Patent Number: 5,964,353
[45] Date of Patent: Oct. 12, 1999

[54] ENERGY ABSORBING CARRIER TAPE

[75] Inventor: Robert N. Hamlin, Stillwater, Minn.

[73] Assignee: Ilinois Tool Works Inc., Glenview, Ill.

[21] Appl. No.: 08/906,076

[22] Filed: Aug. 5, 1997

Related U.S. Application Data

[63] Continuation-in-part of application No. 08/650,319, May 20, 1996, abandoned.

[30] Foreign Application Priority Data

Apr. 8, 1997 [SG] Singapore ............................ 9701069

[51] Int. Cl.$^6$ ........................................... B65D 73/02
[52] U.S. Cl. .......................... 206/714; 206/725; 206/505
[58] Field of Search ................... 206/713–717, 206/725, 726, 505, 509

[56] References Cited

U.S. PATENT DOCUMENTS

| | | |
|---|---|---|
| 3,199,419 | 8/1965 | Lang, Jr. . |
| 3,311,229 | 3/1967 | Troll et al. . |
| 3,465,874 | 9/1969 | Hugle et al. . |
| 3,858,721 | 1/1975 | Boyer et al. . |
| 3,946,864 | 3/1976 | Hutson . |
| 4,272,473 | 6/1981 | Riemersma et al. . |
| 4,411,362 | 10/1983 | Itemadani et al. . |
| 4,562,924 | 1/1986 | Okamoto . |
| 4,564,880 | 1/1986 | Christ et al. . |
| 4,702,370 | 10/1987 | Honda . |
| 4,712,675 | 12/1987 | Scholten et al. . |
| 4,819,801 | 4/1989 | Howard . |
| 4,898,275 | 2/1990 | Skrtic et al. . |
| 4,963,405 | 10/1990 | Yamashita et al. . |
| 4,966,281 | 10/1990 | Kawanishi et al. . |
| 4,966,282 | 10/1990 | Kawanishi et al. . |
| 5,026,303 | 6/1991 | Matsuoka et al. . |
| 5,066,245 | 11/1991 | Walker . |
| 5,076,427 | 12/1991 | Thomson et al. . |
| 5,101,975 | 4/1992 | Runyon et al. . |
| 5,115,911 | 5/1992 | Schulte et al. . |
| 5,132,160 | 7/1992 | Bird . |
| 5,136,827 | 8/1992 | Sawaya . |
| 5,152,393 | 10/1992 | Chenoweth . |
| 5,199,564 | 4/1993 | Skrtic . |
| 5,226,226 | 7/1993 | Fierkens . |
| 5,234,104 | 8/1993 | Schulte et al. . |
| 5,259,500 | 11/1993 | Alvite et al. . |

(List continued on next page.)

FOREIGN PATENT DOCUMENTS

| | | |
|---|---|---|
| 0045368 | 2/1990 | Japan . |
| 0127256 | 5/1990 | Japan . |
| 404201872 | 7/1992 | Japan . |
| 405170275 | 7/1993 | Japan . |

*Primary Examiner*—Paul T. Sewell
*Assistant Examiner*—Nhan T. Lam
*Attorney, Agent, or Firm*—Alan Kamrath Oppenheimer Wolff & Donnelly LLP

[57] ABSTRACT

Carrier tape (12) is disclosed which absorbs kinetic energy and protects the leads (34, 34') of electronic circuit components (32) from bending or being otherwise damaged in an industry drop test. The components (32) are supported in pockets (22) by platforms (40) which are free of ridges extending above the bottoms of the components (32). The free ends of the leads (34) simultaneously engage ramp portions (42) of the pocket sidewalls (24) which are inclined upwardly and outwardly from the pocket bottoms (26) to center the components (32) in the pockets (22). The pockets (22) are of a size to sandwich the components (32) against the platforms (40) when the carrier tape (12) is in a stacked arrangement such as by being wound on a reel (58). The pocket bottoms (26) include undercuts (54) allowing the pocket bottoms (26) in an upper layer to sandwich two different components (32) in two circumferentially adjacent pockets (22) of the lower layer. In other forms, the pockets (22) include protrusions (60) having abutment surfaces (64) which abut with the cover tape (56) for clamping the components (32) against the platforms (40) of the lower layer and which deflect the platforms (40) of the upper layer for raising the components (32) against the cover tape (56).

26 Claims, 3 Drawing Sheets

U.S. PATENT DOCUMENTS 5,265,723 11/1993 Chenoweth .
5,333,733 8/1994 Murata .
5,351,821 10/1994 Skrtic .
5,361,901 11/1994 Schenz et al. .
5,390,472 2/1995 Weiler et al. .
5,499,717 3/1996 Hayashi .
5,524,765 6/1996 Gutentag .

ENERGY ABSORBING CARRIER TAPE

CROSS REFERENCE

The present application is a continuation-in-part of application Ser. No. 08/650,319 filed May 20, 1996, now abandoned.

BACKGROUND

The present invention generally relates to packaging methods for electronic circuit components, particularly to improved carrier tapes for electronic circuit components, and specifically to improved carrier tapes for electronic circuit components for protecting the electronic circuit components in the event that the reel of carrier tape is dropped.

A common packaging method for electronic circuit components such as microchips and utilized in robotic based board assembly is placement into pockets located at precise intervals on a carrier medium. Specifically, such pockets could be arranged in arrays of rows and columns in trays and, especially common for small resistors, capacitors, and memory boards for surface mount assembly of circuit boards, could be arranged in continuous columns in carrier tapes. An example of an advantageous carrier tape is shown and described in U.S. patent appln. Ser. No. 08/631,665 which is hereby incorporated herein by reference.

An example of such an electronic circuit component is the QFP and TQFP product which is a rectangular or square format, thin cross section package with leads extending from all four sides. The leads are spaced in close proximity in the neighborhood of 0.5 mm centers, are 0.2 mm wide by 1 mm long, and are "gull winged" in format. The leads are fragile and must be protected from harsh contact with the carrier tape during transport. Carrier tapes utilize pedestals to support the component in the pocket. Conventional carrier tape confines the body of the component by use of small ridges on or near the pedestals that nest under the gull wing shaped leads and next to the body such that the free ends of the leads of the component are spaced from and ideally do not engage the sidewalls of the pocket. This works well for centering the electronic circuit component in the pocket of the carrier tape.

The IC industry conducts a drop test on the final packaging system which includes carrier tape, cover tape, reel, static control bag, "pizza" box and outer shipping box. It has been reported that 30% of the electronic circuit components sustain damage during drop testing using current tape technology. The mode of failure is lead bending resulting from the rapid deceleration of the electronic circuit components against the near vertical sidewall of the carrier tape pocket after the electronic circuit components "jump" their restraining centering ridges. Specifically, in a drop test, the body of the electronic circuit component "jumps" the centering ridges and the leads of the electronic circuit component collide with the near vertical sidewalls of the carrier tape pocket. Once the body of the electronic circuit component has jumped the ridges, then the ridges can bend the leads. In a drop test of 3 feet, deceleration forces can range from 100 to 10,000 G's depending upon how much deformation one assumes takes place at the box versus at the carrier tape interface. It can be appreciated that the centering ridges of conventional carrier tape pockets do not protect the electronic circuit component from drop damage and in fact are a major source of component failure.

Thus, a need continues to exist in the field of electronic circuit component packaging methods for carrier tape designed to absorb kinetic energy and protect the electronic circuit component from damage and especially protecting the leads of the electronic circuit component from bending, crushing or abrasion.

SUMMARY

This need and other problems in the field of packaging for electronic circuit components have been solved by providing, in the most preferred form, ramp portions in the sidewalls of the pocket of the carrier which are inclined upwardly and outwardly and for engaging the free ends of the leads of the electronic circuit component when centered and supported in the pocket. In an aspect of the present invention, the electronic circuit component is supported in the pocket by a platform which is free of protrusions extending above the bottom of the body of the electronic circuit component. Thus, the electronic circuit component is free to slide on the platform to center itself in the pocket when positioned therein. Further, there is less tendency for leads to be bent or otherwise damaged in the event that external forces cause movement of the electronic circuit component on the platform.

In a further aspect of the present invention, the bottom of the pocket is sized smaller than the periphery of the body of the electronic circuit component and thus also of the pocket at the back face of the carrier medium. The upper pocket sandwiches the electronic circuit component against the platform of a lower pocket to clamp the electronic circuit component in the lower pocket. Such clamping force resists movement of the electronic circuit component in the pocket in the event that external forces are placed on the carrier. Thus, the carrier is able to absorb kinetic energy and protect the leads of the electronic circuit component from bending, abrasion, or other damage. In an additional aspect of the present invention, the pocket bottom includes an undercut to prevent abutment of the pocket bottom with the front face of the carrier in the event that the upper pocket spans two, circumferentially adjacent, lower pockets and the thickness of the body of the electronic circuit component is such that a gap exists between the front face of the carrier and the top of the electronic circuit component. In other aspects of the present invention, the pocket includes a protrusion having an abutment surface which abuts with the cover tape for clamping the electronic circuit component against the platform of the lower layer and which deflects the platform of the upper layer for raising the electronic circuit component against the cover tape.

It is thus an object of the present invention to provide a novel carrier for electronic circuit components such as microchips.

It is further an object of the present invention to provide such a novel carrier in the preferred form of a carrier tape.

It is further an object of the present invention to provide such a novel carrier protecting the leads from bending or other damage during engagement with the sidewalls of the pockets of the carrier.

It is further an object of the present invention to provide such a novel carrier protecting leads from abrasion damage as a result of the electronic circuit component sliding in the pocket of the carrier.

It is further an object of the present invention to provide such a novel carrier which absorbs kinetic energy.

It is further an object of the present invention to provide such a novel carrier allowing the electronic circuit component to center itself in the pocket by simply sliding on the support provisions.

It is further an object of the present invention to provide such a novel carrier which places a clamping force on the body of the electronic circuit component when the pockets are arranged in layers.

It is further an object of the present invention to provide such a novel carrier which raises the electronic circuit component against the cover tape when the pockets are arranged in layers.

It is further an object of the present invention to provide such a novel carrier which supports the body of the electronic circuit component by provisions which are free of ridges or protuberances extending above the bottom of the body of the electronic circuit component.

These and further objects and advantages of the present invention will become clearer in light of the following detailed description of illustrative embodiments of this invention described in connection with the drawings.

DESCRIPTION OF THE DRAWINGS

The illustrative embodiments may best be described by reference to the accompanying drawings where.

All figures are drawn for ease of explanation of the basic teachings of the present invention only; the extensions of the figures with respect to number, position, relationship, and dimensions of the parts to form the preferred embodiment will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

Where used in the various figures of the drawings, the same numerals designate the same or similar parts. Furthermore, when the terms "first", "second", "front", "back", "upper", "lower", "height", "width", "length", "thickness", "end", "side", "horizontal", "vertical", "longitudinal", "lateral", and similar terms are used herein, it should be understood that these terms have reference only to the structure shown in the drawings as it would appear to a person viewing the drawings and are utilized only to facilitate describing the invention.

DESCRIPTION

A carrier tape according to the preferred teachings of the present invention is shown in the drawings and generally designated 12. Carrier tape 12 generally includes a carrier medium in the preferred form of an elongated strip 14 made of semi-flexible, deformable material such as plastic and the like, with strip 14 including a front face 16 and a back face 18. A plurality of longitudinally spaced, indexing holes 20 extend through strip 14 in input strips located parallel to and adjacent one or both edges of strip 14 in the most preferred form. Holes 20 serve as a finished product feature required by carrier tape 12 in the industry as set forth in Electronic Industries Association standards such as holes 20 can be 1.5 mm in diameter on 4 mm centers.

A plurality of pockets 22 are provided at precise intervals on the carrier medium and in the preferred form shown are longitudinally spaced in a column extending parallel to index holes 20 and the edges of strip 14 and recessed from face 16 and extending beyond face 18 of strip 14. Each pocket 22 includes sidewalls 24 and a bottom 26 generally parallel to faces 16 and 18 and located on the opposite side of face 18 than face 16. Suitable provisions 28 are provided for positioning a product such as a microchip or like electronic circuit component within pocket 22 with the leads of the microchip not engaging bottom 26. A hole 30 of nominal size in the order of 1.5 to 2.0 mm diameter is typically formed within provisions 28 per Electronic Industries Association standards.

In the preferred embodiments shown, pockets 22 are of the type for receiving an electronic circuit component 32 in the form of a semiconductor I.C. device in one form having a plurality of fine pitch leads 34 extending outwardly from the sides of its body 36, with leads 34 extending from all four sides of body 36 being shown. Carrier tape 12 according to the preferred teachings of the present invention is especially adapted for components 32 having body 36 of a shape of a right parallelepiped and specifically of a square or a rectangle with a length to width ratio not exceeding a range of 1:1.3 or so, with QFP and TQFP products being components 32 especially benefiting from the teachings of the present invention. Leads 34 are generally equally spaced along the sides of body 36 and extend from midway between the top and bottom of body 36. Leads 34 in the preferred form are gull wing shaped and terminate in free ends which are generally linear and parallel to the sides of body 36. The sides of body 36 can be chamfered or tapered at about 10° from the top and bottom to where leads 34 extend therefrom. However, it should be appreciated that component 32 can be of other forms, shapes, and the like according to the teachings of the present invention and that the teachings of the present invention are not limited to the particular form and shape of component 32 shown.

In the most preferred form, provisions 28 are in the form of a pedestal generally including a planar platform 40 of a shape corresponding to but of a size smaller than the perimeter of the sides of body 36. In the most preferred form, hole 30 is formed in platform 40. Platform 40 is held at a parallel, elevated position above bottom 26 by an integral skirt 41 integrally extending between platform 40 and bottom 26. Skirt 41 in the most preferred form is frustopyramid in shape of an increasing size extending from platform 40, with skirt 41 extending at an obtuse angle in the order of 105° from platform 40. The lower edge of skirt 41 integrally secured to bottom 26 in the most preferred form is of a shape corresponding to but of a size smaller than the perimeter of the sides of body 36 and represents the minimum size of bottom 26 in directions both perpendicular and parallel to the direction of index holes 20.

However, provisions 28 can be of other forms than a single pedestal of a generally right parallelepiped or square shape as shown. As an example, provisions 28 could be in the form of first and second, spaced, parallel pedestals of generally rectangular shape. Such pedestals could be arranged with their long dimension arranged perpendicular to the direction of index holes 20. Hole 30 could be formed in bottom 26 intermediate such first and second pedestals. Platform 40 defined by the top surfaces of such first and second pedestals would be planar but would have an area which is not continuous and which is substantially less than the area of the bottom of body 36 of component 32.

Component 32 is supported in pocket 22 by the bottom of body 36 abutting with platform 40 and located intermediate bottom 26 of pocket 22 and face 18. In the most preferred form, platform 40 and provisions 28 are free of ridges or similar protrusions extending above the bottom of body 36 of component 32 when supported on platform 40. Thus, component 32 is not confined by provisions 28 and generally is free to slide on platform 40 in any direction parallel to platform 40.

Sidewalls 24 extend from face 18 to bottom 26. In the most preferred form, sidewalls 24 each generally include a ramp portion 42 located at a position intermediate bottom 26 and face 18 corresponding to that of the free ends of leads 34. In the most preferred form, ramp portion 42 is inclined at an angle of 30° upwardly and outwardly from bottom 26. Further, in the most preferred form, the spacing between ramp portions 42 on opposite sides of provisions 28 is such that with component 32 centered in pocket 20 and with the bottom of body 36 flushly abutting with platform 40, all of the free ends of leads 34 will simultaneously engage ramp portions 42 of all four sidewalls 24. In the preferred form, ramp portions 42 do not extend in a single plane but specifically are arcuate in shape.

Sidewalls 24 further include transition portions between ramp portions 42 and face 18 and bottom 26. Specifically, in the preferred form, first transition portions 44 are located intermediate face 18 and ramp portions 42 and specifically extend from face 18 to the upper edges of ramp portions 42. Second transition portions 46 extend from bottom 26 to the lower edges of ramp portions 42. In the most preferred form, transition portions 44 are generally planar and are near vertical and extend at an angle up to 90° from face 18. Transition portions 44 provide the necessary depth to pocket 22 such that the top of body 36 of component 32 supported on provisions 28 is located at or slightly below the plane of face 16 while minimizing the dimensions of pocket 22 than if the angle of incline of ramp portions 42 would have been continued up to face 18.

In the embodiment shown, transition portions 46 include an annular flange 48 having a frustopyramid shape of an increasing size extending from bottom 26. The upper edges of annular flange 48 integrally terminate in the inner edge of an annular ring 50 located parallel to and intermediate bottom 26 and platform 40. The lower edges of ramp portions 42 are integrally formed with a lip 52 extending slightly downward from the outer edge of annular ring 50. The lower edge of flange 48 has a shape corresponding to but of a size generally equal to or slightly smaller than the perimeter of the sides of body 36 and corresponding to but of a size smaller than pocket 22 at face 18. The upper edge of flange 48, lip 52, and transition portions 44 have a shape corresponding to but of a size larger than the perimeter of the sides of body 36 of component 32. The function of the configuration of transition portions 46 is to insure that during the manufacturing process, ramp portions 42 have the desired shape. Specifically, during forming, sidewalls 24 could simply extend generally vertically to bottom 26 in the event that the forming process did not have an approach to draw or force the molten material into the desired shape. The particular configuration of transition portions 46 as shown and described is an approach which insures the acceptable formation of ramp portions 42 during production. It can be realized that transition portions 46 can have other shapes and configurations and/or that other approaches can be utilized to obtain accurate formation of ramp portions 42 in the sidewalls 24 during fabrication of carrier tape 12. It should further be realized that sidewalls 24 including ramp portions 42 according to the teachings of the present invention can have other configurations. As an example, sidewalls 24 could be configured not to have distinct regions such as between ramp portions 42 and transition portions 46 and 48 but rather to have a continuous shape such as being parabolic or hyperbolic in cross section. Similarly, sidewalls 24 could be configured to include a first frustopyramid shaped portion extending upwardly and outwardly from bottom 26 at an angle in the order of 30° and integrally terminating in a second frustopyramid shaped portion extending upwardly and outwardly at an angle in the order of 57° and which in turn integrally terminates in a tubular portion with near vertical walls. In this arrangement, the free ends of leads 34 with component 32 centered on provisions 28 could abut sidewalls 24 at the intersection of the first and second frustopyramid shaped portions. Similarly, ramp portions 42 could include planar, arcuate, combinations thereof, or other shapes according to the teachings of the present invention.

In the preferred form shown, bottom 26 is generally annular in shape and defined by and between the lower edges of flange 48 and of skirt 41. In the most preferred form, the portions of bottom 26 parallel to index holes 20 and intermediate the linear portions of bottom 26 extending perpendicular to the direction of index holes 20 include an undercut 54 extending generally parallel to bottom 26. Such linear portions of bottom 26 thus extend parallel to and adjacent to the opposing sides of body 36 extending perpendicular to the direction of index holes 20. Undercut 54 is spaced above bottom 26 a distance generally equal to the greatest acceptable spacing allowed by Electronic Industries Association standards between the top of body 36 of component 32 and face 16 and in the most preferred form is generally equal to 0.2 mm.

Figure 1:
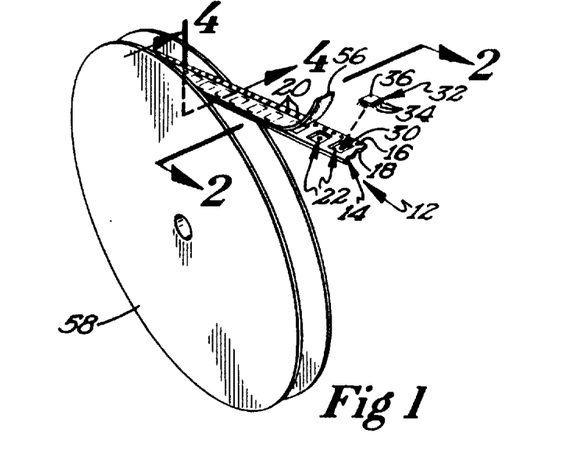
FIG. 1 shows a perspective view of a carrier tape according to the preferred teachings of the present invention being wound on a reel, with an electronic circuit component being exploded therefrom.
Figure 2:
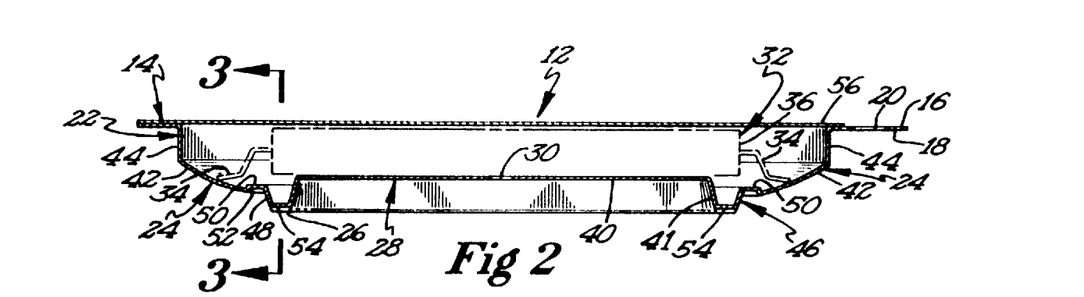
FIG. 2 shows a cross-sectional view of the carrier tape of FIG. 1 according to section line 2—2 of FIG. 1.

In the packaging method of the present invention, component 32 is lightly positioned and released in pocket 22. It should be realized that component 32 could be positioned off center in pocket 22 such as in a direction parallel to index holes 20 and to the right in FIG. 2. The free ends of leads 34 on the right in FIG. 2 would engage ramp portion 42 extending generally perpendicular to the direction of index holes 20 and above the position as shown, body 36 would not flushly abut with platform 40 but would abut along a line adjacent to the left edge of platform 40 in FIG. 2, and the free ends of leads 34 on the left in FIG. 2 would be spaced from sidewall 24. Under gravitational forces and from such a position, the free ends of leads 34 would slide down ramp portion 42 to the position as shown. Due to the inclined nature of ramp portion 42, as leads 34 slide downwardly, leads 34 and component 32 are forced to the left and body 36 will move to flushly abut with platform 40. When body 36 flushly abuts with platform 40, the free ends of leads 34 on the opposite side of component 32 simultaneously abut with ramp portion 42 on the opposite side of pocket 22 in the most preferred form. It should be realized that component 32 will not have a tendency to continue to move to the left as to do so would require the free ends of leads 34 on the left side of FIG. 2 to ride up ramp portion 42 and move against gravitational forces. Thus, pocket 22 according to the teachings of the present invention centers component 32 therein. If leads 34 of component 32 should not slide down ramp portion 42 until body 36 flushly abuts with platform 40 due to gravitational forces alone such as the result of frictional forces, the normal movement of carrier tape 12 after component 32 has been placed in pocket 22 should jostle component 32 sufficiently to cause leads 34 to slide down ramp portion 42 to thereby center component 32 in pocket 22.

Figure 3:
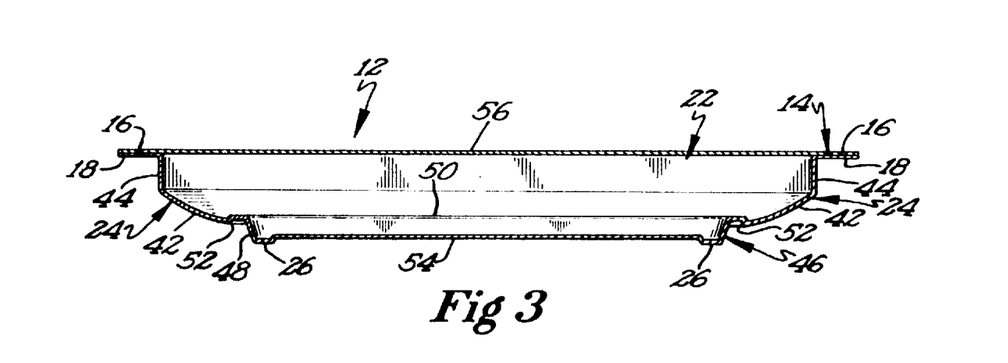
FIG. 3 shows a cross-sectional view of the carrier tape of FIG. 1 according to section line 3—3 of FIG. 2.

Similarly, component 32 could be positioned off center in pocket 22 in a direction perpendicular to the direction of index holes 20 and to the right or left in FIG. 3. In that situation, the free ends of leads 34 on the sides of body 36 parallel to the direction of index holes 20 would engage and slide down the respective ramp portion 42 also extending parallel to the direction of index holes 20. Thus, pocket 22 would similarly center component 32 in a direction perpendicular to the direction of index holes 20. It should be realized that assuming component 32 has leads 34 extending from all four sides of body 36, pocket 22 according to the teachings of the present invention will center component 32 therein whether or not component 32 is off center in a direction parallel or perpendicular to the direction of index holes 20 or combinations thereof and whether or not the sides of body 36 of component 32 are arranged parallel or non-parallel to directions parallel or perpendicular to the direction of index holes 20. Further, it should be realized that the risk of bending leads 34 is minimal as generally several leads 34 will simultaneously engage sidewalls 24 so that the forces are spread out and not concentrated on a single or a few leads 34. Further, the forces involved are minimal and generally are limited to gravitational forces, with such forces typically being insufficient to bend or otherwise damage leads 34.

After components 32 are placed in pockets 22, a cover tape 56 of any desired type is suitably secured to face 16 of carrier tape 12. Carrier tape 12 including components 32 in pockets 22 covered by cover tape 56 is then conventionally wound on a reel 58. After wound on reel 58, reel 58 is placed within a static control bag and then into its individual "pizza" box. Several individual "pizza" boxes are then placed in an outer shipping box for storage and transport.

When wound on reel 58, carrier tape 12 has a configuration of an increasing spiral with bottoms 26 of pockets 22 of one wrap abutting with cover tape 56 of the wrap below. It should further be realized that the periphery of any particular wrap and thus the length of carrier tape 12 in any particular wrap increases from the center of reel 58 outward. Thus, pockets 22 are not necessarily stacked on top of each other in a radial direction such as diagramatically shown in the top two layers of FIG. 4 but rather are often in an overlapping condition as diagramatically shown in the bottom five layers of FIG. 4. The relative position of pockets 22 between wraps then depends on numerous factors including but not limited to the radial spacing from the center of reel 58, the depth of pockets 22, the tension in wrapping carrier tape 12, and similar factors. The diagramatic showing of FIG. 4 represents several of the possible relative positions of pockets 22 in different layers of wrap.

Figure 4:
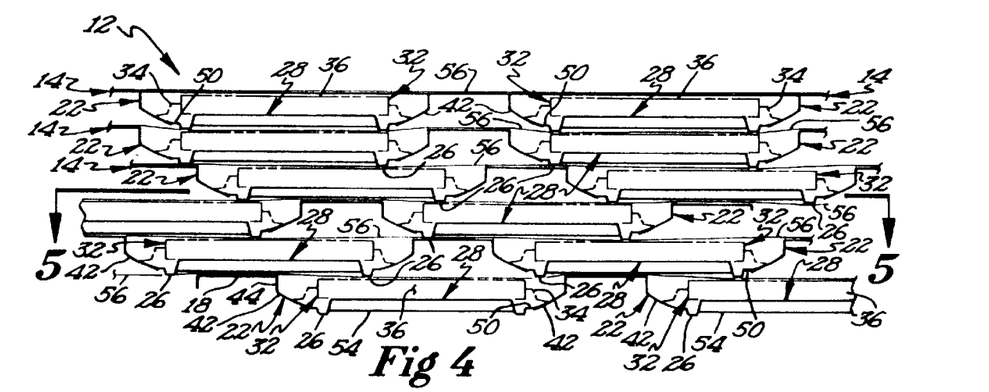
FIG. 4 shows a diagrammatic cross-sectional view of a portion of the carrier tape as wound on the reel of FIG. 1 according to section line 4—4 of FIG. 1.
Figure 5:
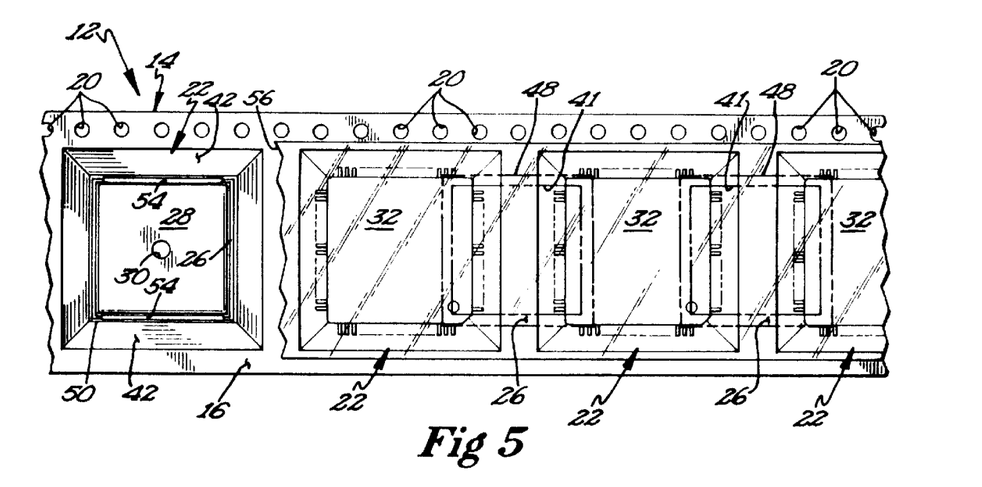
FIG. 5 shows a diagrammatic top view of the carrier tape of FIG. 1 according to view line 5—5 of FIG. 4.

One possibility is that pockets 22 are exactly radially aligned as illustrated in the fifth and sixth layers which are the top two layers of FIG. 4. As the size of bottom 26 at the lower edge of skirt 41 is less than the periphery of the sides of body 36, bottom 26 of the top layer will abut with cover film 56 of the fifth layer. It should be understood that if a gap exists between the top of body 36 and cover tape 56 in the fifth layer, bottoms 26 of pockets 22 of the top layer will deflect cover tape 56 to engage the top of body 36 due to the winding tension placed on carrier tape 12 as it is being wound upon reel 58. Thus, body 36 and cover film 56 of the fifth layer is tightly sandwiched between platform 40 of the fifth layer and bottom 26 of pocket 22 of the sixth layer. Due to this sandwiching force, body 36 in the fifth layer is thereby clamped in position in pocket 22 to resist movement therein.

Another possibility is illustrated in the fourth and fifth layers of FIG. 4 where the linear portion of bottom 26 of the fifth layer extending perpendicular to the direction of index holes 20 to the right in FIG. 4 engages cover tape 56 intermediate the sides of body 36 of the fourth layer and the linear portion of bottom 26 to the left in FIG. 4 engages cover tape 56 extending over face 16 intermediate two adjacent pockets 22 of the fourth layer. Thus, body 36 and cover tape 56 of the fourth layer is tightly sandwiched between platform 40 of the fourth layer and the linear portion of bottom 26 of the fifth layer to the right in FIG. 4. Due to this sandwiching force, body 36 in the fourth layer is thereby clamped in position in pocket 22 to resist movement therein. Similarly, body 36 in the second layer is clamped in position by the linear portions of bottom 26 of the third layer extending perpendicular to the direction of index holes 20 to the right in FIG. 4.

Another possibility is illustrated in the third and fourth layers of FIG. 4 where the linear portion of bottom 26 of the fourth layer extending perpendicular to the direction of index holes 20 to the right in FIG. 4 engages cover tape 56 intermediate the sides of body 36 of one component 32 of the third layer and the linear portion of bottom 26 to the left in FIG. 4 engages cover tape 56 intermediate the sides of body 36 of the next component 32 in the circumferentially adjacent pocket 22 to the left in FIG. 4. It should be realized that body 36 of any particular pocket in the third layer of FIG. 4 is engaged by the linear portions of bottom 26 extending perpendicular to index holes 20 of two different pockets 22 of the fourth layer. The purpose of undercuts 54 can now be explained. In particular, the portions of bottom 26 of pockets 22 of the fourth layer parallel to the direction of index holes 20 extends over the face 16 intermediate two adjacent pockets 22 of the third layer. In the event that bodies 36 have a height less than the distance between the top surface of platform 40 and face 16, it is necessary for the linear portions of bottom 26 extending perpendicular to index holes 20 to deflect cover tape 56 into pockets 22 of the third layer and thus be located below the level of cover tape 56 and face 16. Without undercuts 54, the portions of bottom 26 parallel to index holes 20 of the fourth layer would abut against cover tape 56 and face 16 intermediate pockets 22 of the third layer which would act like a fulcrum and absorb part of the tension forces arising from winding carrier tape 12 in reel 58. Thus, undercuts 54 allow the linear portions of bottom 26 of a single pocket 22 in an upper layer to engage and apply a clamping force to two different components 32 in two circumferentially adjacent pockets 22 of the lower layer. It should be realized that undercuts 54 are not required in the event that bodies 36 have a height generally equal to the distance between the top surface of platform 40 and face 16 such that fulcrum situations do not arise and/or if the forces absorbed by carrier tape 12 between pockets 22 do not sufficiently detract from the clamping forces placed on components 32.

Another possibility is illustrated in the first and second layers which are the bottom two layers of FIG. 4 where the linear portion of bottom 26 of the second layer extending perpendicular to the direction of index holes 20 to the right in FIG. 4 engages cover tape 56 intermediate the sides of body 36 of one component 32 of the bottom layer and the linear portion of bottom 26 to the left in FIG. 4 engages cover tape 56 intermediate component 32 in the circumferentially adjacent pocket 22 to the left in FIG. 4 and face 16 intermediate the two adjacent pockets 22 of the bottom layer. It should be realized that the portions of bottom 26 extending parallel to the direction of index holes 20 would engage cover tape 56 and particularly undercuts 54 in the most preferred form and sandwich it against face 16 intermediate the two adjacent pockets 22 of the bottom layer and thereby prevent the linear portion of bottom 26 extending perpendicular to index holes 20 to the left in FIG. 4 from extending into pocket 22 in a manner to engage leads 34 of component 32. It should also be realized that due to undercuts 54, cover tape 56 will be deflected from its plane extending over face 16 with cover film 56 thus being placed under tension and in the most preferred form placing a clamping force against body 36 towards platform 40. Due to these forces, body 36 in the bottom layer is thereby clamped in position in pocket 22 to resist movement therein.

It should be appreciated that as components 32 are clamped in position on platforms 40 of their respective pockets 22 according to the teachings of the present invention, considerable force is required to move components 32 in pockets 22. Thus, in a drop test, the forces at which leads 34 collide with sidewalls 24 of pockets 22 is substantially less than if components 32 were not under a clamping force in pockets 22. Specifically, such collision forces should be sufficiently small to minimize or generally eliminate the possibility of bending or otherwise damaging leads 34.

In the event that forces are applied to component 32 which would tend to move component 32 in pocket 22 of the type of the present invention, several dynamics are involved. Specifically, due to the angle of incline of ramp portions 42, the free ends of leads 34 engage sidewalls 24 in a manner to flex leads 34. It should be appreciated that collectively, considerable force can be absorbed by leads 34 before bending or other damage to leads 34 occurs. Thus, pockets 22 of the present invention the spring effect provided by leads 34 of component 32. Further, due to the incline of ramp portions 42, the height of the free ends of leads 34 increases as component 32 moves in a direction parallel to platform 40. Due to this increase in height, leads 34 place a force on body 36 to raise the respective side of body 36 from platform 40. In addition to the forces necessary to do this, force will be necessary to deflect cover tape 56 outwardly. In addition, according to the most preferred teachings of the present invention, the raising of body 36 from platform 40 is further resisted by the clamping force provided by being sandwiched by bottom 26 against platform 40. Thus, bending or other damage to leads 34 of components 32 is minimized or generally eliminated when reel 58 is subjected to considerable outside forces such as would be present in a drop test or from vibration forces experienced during transportation in a truck, plane or the like.

Contrary to the conventional approach of attempting to position components 32 inside of pockets 22 in a manner such that leads 34 do not engage sidewalls 24, pockets 22 according to the preferred teachings of the present invention are shaped such that leads 34 engage with sidewalls 24. In this regard, sidewalls 24 are configured in a manner such that the engagement therewith by leads 34 is in a controlled manner to center component 32 in pocket 22 and to absorb kinetic energy and protect leads 34 from damage as the result of reel 58 being subjected to outside forces such as encountered in a drop test. A major advantage of pocket 22 of the present invention is that provisions 28 can be formed by a platform 40 of a generally planar nature and specifically does not require any ridges or other protrusions which extend above the plane of the bottom of body 36 when supported by provisions 28 in pocket 22. Such ridges or protrusions were a major cause of damage to leads 34 in prior carrier tapes.

Figure 6:
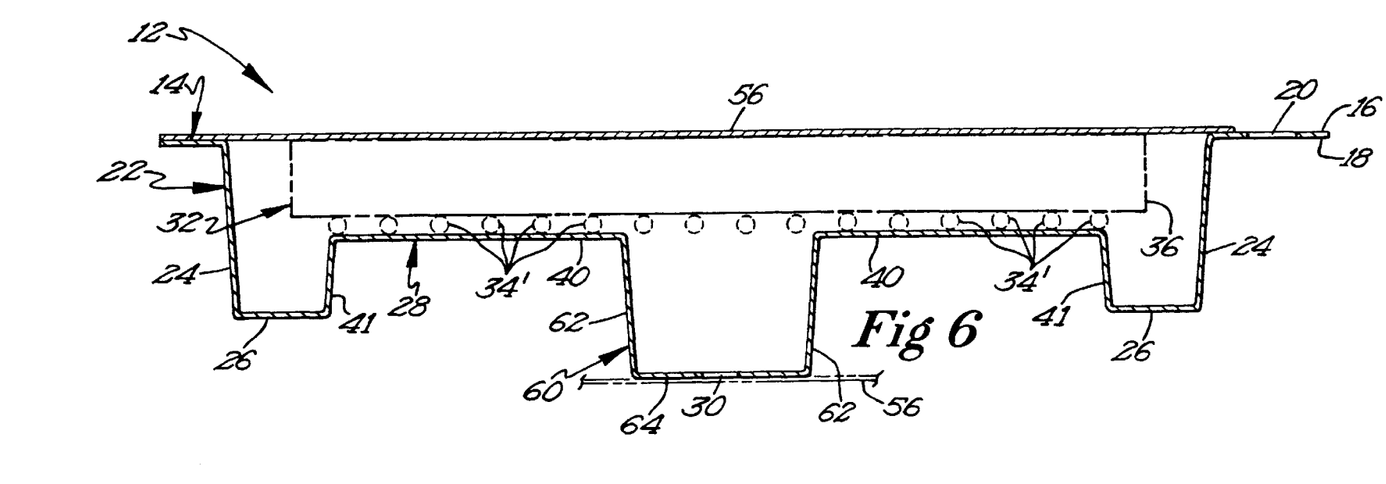
FIGS. 6 and 7 show cross-sectional views of alternate forms of carrier tapes according to the preferred teachings of the present invention.

Additionally, the clamping force provided on body 36 of component 32 by being sandwiched between platform 40 and cover tape 56 (and pocket 22 of an upper layer) can be enhanced. Specifically, in a preferred form, pockets 22 are designed such that provisions 28 for supporting component 32 deflect to raise or lift component 32 towards cover tape 56 (and pocket 22 of an upper layer). For example, provisions 28 of pocket 22 could include a protrusion 60 generally in the center of bottom 26 such as shown in FIG. 6. Specifically, protrusion 60 shown includes a rim 62 integrally extending from platform 40 and integrally terminating in an abutment surface 64 including hole 30. Rim 62 in the preferred form is of decreasing size from platform 40 to surface 64 and in the most preferred form is frusto-shaped such as frustoconical or frustopyramid shaped. The spacing of surface 64 from back face 18 of strip 14 is greater than the other portions of bottom 26 from back face 18 and particularly the portions of bottom 26 between sidewall 24 and skirt 41 and than platform 40. In the most preferred form, abutment surface 64 is spaced from bottom 26 in the range of 0.2 to 1.0 mm. As the size of abutment surface 64 is less than the periphery of the sides of body 36 and of platform 40, abutment surface 64 will abut with cover film 56 when stacked in an upper layer and a lower layer such as when wound on reel 58. Thus, surfaces 64 of pockets 22 of the upper layer will deflect cover tape 56 to engage the top of body 36 in the lower layer due to the winding tension placed on carrier tape 12 as it is being wound upon reel 58. Thus, body 36 and cover film 56 of the lower layer are tightly sandwiched between platform 40 of the lower layer and surface 64 of pocket 22 of the upper layer and are thereby clamped in position in pocket 22 to resist movement therein. Furthermore, due to the increased spacing of surface 64 from back face 18, the winding tension placed on carrier tape 12 as it is wound upon reel 58 will tend to deflect platform 40 of the upper layer upward and away from the lower layer so that body 36 is raised or lifted in pocket 22 of the upper layer to engage cover tape 56 of the upper layer and thereby sandwich body 36 between cover tape 56 and platform 40 of the upper layer. It should be noted that the symmetrical positioning of protrusion 60 in pocket 22 controls the deflection of platform 40 so that component 32 is raised uniformly or squarely towards cover tape 56. The deflection of platform 40 is enhanced in the form shown in FIG. 6 due to the relatively small area of abutment surface 64 relative to the area of the top or bottom of body 36. The form shown in FIG. 6 has special application for components 32 of the ball grid array type including leads 34' in the form of ball contacts extending from the bottom of body 36 in stopping lateral motion of components 32 in pockets 22 for avoiding the abrasion of the free ends of leads 34'.

Figure 7:
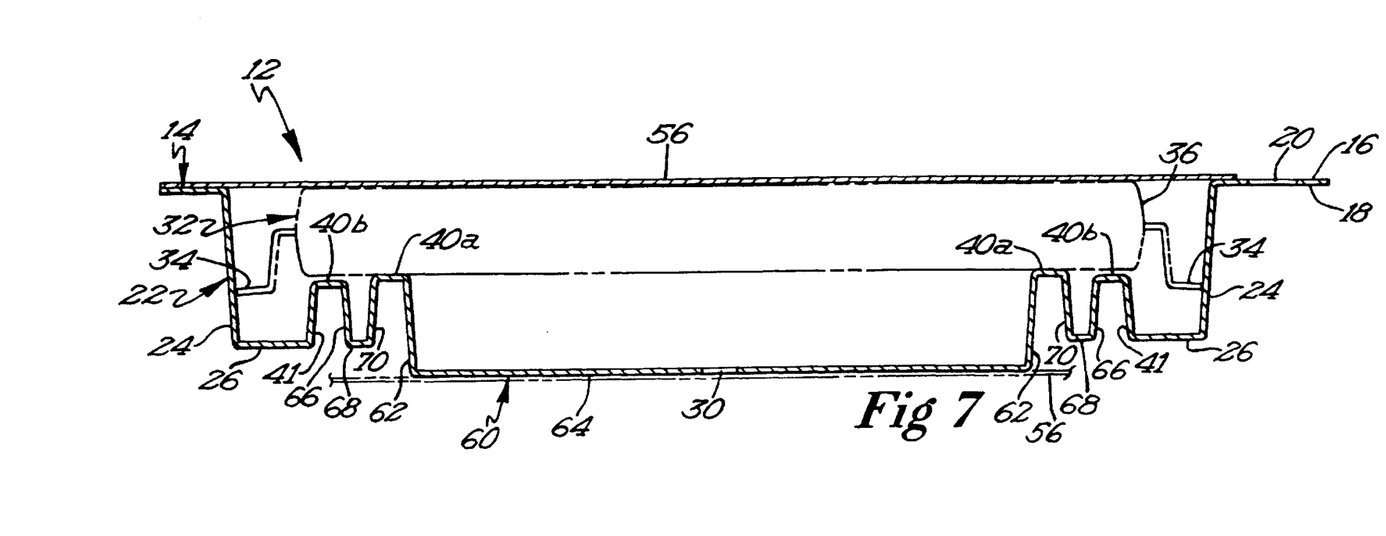

The deflection of platform 40 can be enhanced by other techniques. For example, platform 40 could be of an accordion type shown in FIG. 7 including first and second annular portions 40a and 40b. Skirt 41 integrally extends from the outer periphery of portion 40b and rim 62 integrally extends from the inner periphery of portion 40a. Platform 40 further includes a first pleat portion 66 integrally extending from the inner periphery of portion 40b and is of a decreasing size with increasing spacing from portion 40b. Pleat portion 66 integrally terminates in the outer periphery of an intermediate annular portion 68 which is parallel to bottom 26 and abutment surface 64 and spaced intermediate back face 18 and abutment surface 64 and in the most preferred form at a spacing generally equal to the spacing of bottom 26 from back face 18. A second pleat portion 70 integrally extends from the inner periphery of annular portion 68 and from the outer periphery of portion 40a, with pleat portion 70 having increasing size with increased spacing from portion 40a. In normal conditions, portions 40a and 40b have equal spacing from back face 18. However, when wound upon reel 58, the winding tension placed on carrier tape 12 will tend to deflect platform portion 40a of the upper layer upward so that body 36 is raised or lifted in pocket 22 of the upper layer to engage cover tape 56 of the upper layer and thereby sandwich body 36 between cover tape 56 and platform portion 40a of the upper layer. The accordion type platform 40 including portions 40a, 40b, 66, 68 and 70 enhances the deflection of body 36 upward. It should be appreciated that abutment surface 64 sandwiches body 36 and cover film 56 of the lower layer against platform 40 of the lower layer in a similar manner as set forth for FIG. 6.

Furthermore, the clamping force provided on body 36 of component 32 can be enhanced by providing increased thickness portions on cover tape 56. As an example, the increased thickness portions could be provided on cover tape 56 outside of pocket 22 of the lower layer and for abutting with pocket 22 of the upper layer when carrier tape 12 is wound on reel 58.

Now that the basic teachings of the present invention have been explained, many extensions and variations will be obvious to one skilled in the art. Although in the most preferred form several unique and novel features have been utilized producing synergistic results, such features could be utilized separately or in other combinations according to the teachings of the present invention.

Thus since the invention disclosed herein may be embodied in other specific forms without departing from the spirit or general characteristics thereof, some of which forms have been indicated, the embodiments described therein are to be considered in all respects illustrative and not restrictive. The scope of the invention is to be indicated by the appended claims, rather than by the foregoing description, and all changes which come within the meaning and range of equivalency of the claims are intended to be embraced therein.

I claim:

1. Carrier for an electronic circuit component having a plurality of leads extending outwardly from at least first and second opposing sides of a body, with the body having a top and a bottom, with the leads having free ends, comprising, in combination: a carrier medium including a front face and a back face; and at least a first pocket for receiving the electronic circuit component, with the pocket including first and second sidewalls on opposite sides of the pocket and further including means for supporting the electronic circuit component in the pocket, with the supporting means including a platform adapted to abut with the bottom of the body of the electronic circuit component when supported in the pocket, with the pocket being free of protrusions extending above the platform which would minimize shifting of the electronic circuit components when supported in the pocket, with the sidewalls including ramp portions inclined upwardly and outwardly, and with the ramp portions of the first and second sidewalls on opposite sides of the pocket adapted to engage the free ends of the leads on the first and second sides of the body when the bottom of the body abuts with the platform to center the electronic circuit component in the pocket.

2. The carrier of claim 1 wherein the first and second sidewalls further include a transition portion extending at an angle up to 90° from the back face for providing the necessary depth to the pocket.

3. The carrier of claim 2 wherein the transition portion is located intermediate the back face and the ramp portion.

4. The carrier of claim 1 wherein the pocket includes a pocket bottom, with the bottom of the body being supported in the pocket by the supporting means intermediate the pocket bottom and the back face, with the first and second opposing sides of the body being spaced a first distance, with the pocket bottom extending in a direction between the first and second sidewalls a second distance which is shorter than the first distance, with the pocket being dimensionally smaller at the bottom thereof than at a portion of the back face.

5. The carrier of claim 1 wherein the electronic circuit component has a periphery in the shape of a right parallelepiped and the body includes third and fourth opposing sides; and wherein the pocket includes third and fourth sidewalls on opposite sides of the pocket, with the free ends of the leads on the third and fourth sides of the body engaging with the ramp portions on the third and fourth sidewalls on opposite sides of the pocket when the electronic circuit component is supported in the pocket by the supporting means and centered in the pocket.

6. The carrier of claim 5 wherein the pocket includes a pocket bottom, with the first and second opposing sides of the body being spaced a first distance, with the pocket bottom extending in a direction between the first and second sidewalls a second distance which is shorter than the first distance, with the third and fourth opposing sides of the body being spaced a third distance, with the pocket bottom extending in a direction between the third and fourth sidewalls a fourth distance which is shorter than the third distance, with the size of the pocket bottom being smaller than the size of the pocket at the back face.

7. The carrier of claim 1 wherein the free ends of the leads on the first side of the body engage the ramp portion of the first sidewall simultaneously as the free ends of the second side of the body engage the ramp portion of the second sidewall when the electronic circuit component is centered in the pocket.

8. The carrier of claim 1 wherein the ramp portions are inclined at an angle in the order of 300 to the front and back faces.

9. The carrier of claim 1 wherein the ramp portions of each of the sidewalls do not extend in a single plane.

10. The carrier of claim 1 wherein the supporting means comprises a platform for abutting with the bottom of the body, with the platform being planar and of a size smaller than the perimeter of the bottom of the body.

11. The carrier of claim 10 wherein the platform has an area which is not continuous and which is substantially less than the bottom of the body.

12. Carrier for electronic circuit components having a plurality of leads extending outwardly from a body, with the body having at least first and second opposing sides, a top and a bottom, with the leads having free ends, comprising, in combination: a carrier medium including a front face and a back face; and at least a first pocket for receiving the electronic circuit component, with the pocket being provided on the carrier medium and extending beyond the back face, with the pocket including first and second sidewalls on opposite sides of the pocket, with the pocket further including means for supporting the electronic circuit component in the pocket, with the pocket further including a pocket bottom, with the bottom of the body being positioned in the pocket by the supporting means intermediate the pocket bottom and the back face, with the first and second opposing sides of the body being spaced a first distance, with the pocket bottom extending in a direction between the first and second sidewalls a second distance which is shorter than the first distance, with the pocket being dimensionally smaller at the pocket bottom thereof than at an upper portion of the pocket at the back face such that when the carrier medium is stacked in an upper layer and a lower layer, the pocket of the upper layer sandwiches the electronic circuit component against the supporting means in the pocket of the lower layer.

13. The carrier of claim 12 wherein the electronic circuit component has a periphery in the shape of a right parallelepiped and the body includes third and fourth opposing sides, with the third and fourth opposing sides of the body being spaced a third distance; and wherein the pocket includes third and fourth sidewalls on opposite sides of the pocket, with the pocket bottom extending in a direction between the third and fourth sidewalls a fourth distance which is shorter than the third distance.

14. The carrier of claim 13 wherein the pocket bottom includes first and second linear portions extending parallel to the first and second sidewalls, with the pocket bottom being undercut between the first and second linear portions.

15. The carrier of claim 14 wherein the pocket bottom is annular shaped and includes third and fourth linear portions extending parallel to the third and fourth sidewalls.

16. The carrier of claim 12 wherein the supporting means comprises a platform for abutting with the electronic circuit component, with the platform being planar and of a size smaller than the perimeter of the bottom of the body.

17. The carrier of claim 16 wherein the platform has an area which is not continuous and which is substantially less than the bottom of the body.

18. The carrier of claim 12 wherein the supporting means is free of protrusions extending above the bottom of the body of the electronic circuit component when supported in the pocket.

19. The carrier of claim 12 wherein the pocket bottom includes first and second linear portions extending parallel to the first and second sidewalls, with the pocket bottom being undercut between the first and second linear portions.

20. The carrier of claim 12 wherein the carrier medium is made of semi-flexible, deformable material; and wherein the carrier medium is stacked by winding upon a reel.

21. The carrier of claim 12 wherein the plurality of leads extend outwardly from the first and second opposing sides of the body, with the supporting means abutting with the bottom of the body.

22. The carrier of claim 12 wherein the pocket includes a protrusion having an abutment surface spaced from the back face a distance greater than the spacing of the pocket bottom from the back face with the abutment surface of the pocket of the upper layer sandwiching the electronic circuit component against the supporting means in the pocket of the lower layer and deflecting the supporting means in the pocket of the upper layer in a direction away from the lower layer.

23. The carrier of claim 22 wherein the abutment surface has a size which is considerably smaller than the area of the top of the body.

24. The carrier of claim 22 wherein the supporting means comprises a platform of an accordion type including at least first and second portions, with the protrusion deflecting the first portion in the pocket of the upper layer greater than the second portion.

25. A carrier with at least one electronic circuit component having a plurality of leads extending outwardly from at least first and second opposing sides of a body, with the body having a top and a bottom, with the leads having free ends, comprising, in combination: a carrier medium including a front face and a back face; and at least a first pocket for receiving the electronic circuit component, with the pocket including first and second sidewalls on opposite sides of the pocket and farther including means for supporting the electronic circuit component in the pocket, with the pocket being free of protrusions extending above the bottom of the body of the electronic circuit component supported in the pocket and which would minimize shifting of the electronic circuit component when supported in the pocket, and with the sidewalls including ramp portions inclined upwardly and outwardly, with the free ends of the leads on the first and second sides of the body engaging with the ramp portions of the first and second sidewalls on opposite sides of the pocket to center the electronic circuit component in the pocket.

26. Carrier for an electronic circuit component having a plurality of leads extending outwardly from at least first and second opposing sides of a body, with the body having a top and a bottom, with the leads having free ends, comprising, in combination: a carrier medium including a front face and a back face; and at least a first pocket for receiving the electronic circuit component, with the pocket including first and second sidewalls, a pocket bottom, and means for supporting the electronic circuit component in the pocket, with the pocket being free of protrusions extending above the bottom of the body of the electronic circuit component when supported in the pocket and which would minimize shifting of the electronic circuit component when supported in the pocket, with the first and second sidewalls located on opposite sides of the pocket, with the sidewalls including ramp portions inclined upwardly and outwardly from the pocket bottom, with the free ends of the leads on the first and second sides of the body engaging with the ramp portions of the first and second sidewalls on opposite sides of the pocket to center the electronic circuit component in the pocket, with the bottom of the body being supported in the pocket by the supporting means intermediate the pocket bottom and the back face, with the first and second opposing sides of the body being spaced a first distance, with the pocket bottom extending in a direction between the first and second sidewalls a second distance which is shorter than the first distance, with the pocket being dimensionally smaller at the bottom thereof than at a portion of the back face such that when the carrier medium is stacked in an upper layer and a lower layer, the pocket of the upper layer sandwiches the electronic circuit component against the supporting means in the pocket of the lower layer.

* * * * *

UNITED STATES PATENT AND TRADEMARK OFFICE
CERTIFICATE OF CORRECTION

PATENT NO : 5,964,353

DATED : October 12, 1999

INVENTOR(S) : Robert N. Hamlin

It is certified that error appears in the above-identified patent and that said Letters Patent is hereby corrected as shown below:

Col. 11, line 38, cancel "therein" and substitute therefor -- herein --.

Col. 12, line 45, cancel "300" and substitute therefor -- 30° --.

Signed and Sealed this

Fourth Day of April, 2000

Attest:

Q. TODD DICKINSON

Attesting Officer

Director of Patents and Trademarks